United States Patent [19]
Kooi et al.
[11] 3,755,001
[45] Aug. 28, 1973

[54] METHOD OF MAKING SEMICONDUCTOR DEVICES WITH SELECTIVE DOPING AND SELECTIVE OXIDATION

[75] Inventors: Else Kooi; Johannes Arnoldus Appels, both of Emmasingel, Eindhoven, Netherlands

[73] Assignee: U.S. Philips Corporation, New York, N.Y.

[22] Filed: July 8, 1971

[21] Appl. No.: 160,654

[30] Foreign Application Priority Data

July 10, 1970 Netherlands ........................ 7010206

[52] U.S. Cl. .................. 148/1.5, 148/187, 148/175, 317/235 R, 29/572, 148/188, 148/189

[51] Int. Cl. .............................................. H01l 7/54

[58] Field of Search ..................... 148/1.5, 187, 172, 148/175; 317/235

[56] References Cited

UNITED STATES PATENTS

| | | | |
|---|---|---|---|
| 3,386,865 | 6/1968 | Doo | 148/175 |
| 3,544,858 | 12/1970 | Kooi | 317/235 B |
| 3,649,386 | 3/1972 | Murphy | 148/175 |

FOREIGN PATENTS OR APPLICATIONS

| | | | |
|---|---|---|---|
| 826,343 | 10/1969 | Canada | 148/187 |

OTHER PUBLICATIONS

Philips Res. Repts., 25, 118–132 (April 1970).

*Primary Examiner*—G. T. Ozaki
*Attorney*—Frank R. Trifari

[57] ABSTRACT

A method of manufacturing a semiconductor device having an inset oxide pattern obtained by local oxidation, which pattern is bounded only partly by a doped surface zone. According to the invention a first mask is provided on the semiconductor surface after which etching is carried out so that a freely projecting edge of said mask is formed by underetching. During the local doping of the etched surface the masking provided by said edge is used directly or indirectly after which the oxide pattern is provided.

19 Claims, 31 Drawing Figures

*INVENTORS*

ELSE KOOI

JOHANNES ARNOLDUS APPELS

*BY*

AGENT

ELSE KOOI *INVENTORS*
JOHANNES ARNOLDUS APPELS

*BY* [signature]

AGENT

*INVENTORS*
ELSE KOOI
JOHANNES ARNOLDUS APPELS
*BY*
[signature]
AGENT

*INVENTORS*

ELSE KOOI
JOHANNES ARNOLDUS APPELS

*BY*

AGENT

*INVENTORS*

ELSE KOOI
JOHANNES ARNOLDUS APPELS

*BY* Frank R. Trifari

AGENT

*INVENTORS*
ELSE KOOI
JOHANNES ARNOLDUS APPELS
*BY*
AGENT

*INVENTORS*

ELSE KOOI
JOHANNES ARNOLDUS APPELS

*BY*

AGENT

*INVENTORS*
ELSE KOOI
JOHANNES ARNOLDUS APPELS
*BY*
Frank R. Trifari
AGENT

Patented Aug. 28, 1973 3,755,001

9 Sheets-Sheet 9

INVENTORS
ELSE KOOI
JOHANNES ARNOLDUS APPELS
BY
Frank R. Trifari
AGENT

METHOD OF MAKING SEMICONDUCTOR DEVICES WITH SELECTIVE DOPING AND SELECTIVE OXIDATION

The invention relates to a method of manufacturing a semiconductor device having a semiconductor body comprising at least a semiconductor circuit element in which a surface zone of the body is doped with activators and an oxide pattern is provided on at least a part of said surface zone by local oxidation, said pattern being inset or sunken for at least part of its thickness in the semiconductor body.

The invention furthermore relates to a semiconductor device manufactured by using said method.

In this application, activators are to be understood to include, in addition to donors and acceptors, materials which determine other electric properties of the semiconductor material, for example, the lifetime of minority charge carriers.

Methods in which an oxide pattern which is inset at least partly in the semiconductor body is provided by local oxidation of a semiconductor surface are known and are used for many purposes in semiconductor technology. It is also known to dope in this case the semiconductor surface covered by the oxide pattern with donors or acceptors, for example, by diffusion. See for example Canadian patent No.826,343, U.S. Pat. NO.3,544,858 and Philips Research Reports 25, 118–132, April 1970.

In practice, however, the use of oxide patterns in which the whole adjoining semiconductor surface is doped by the incorporation of donor or acceptor elements often meets with difficulties. For example, the doped surface zone may extend up to another, highly doped layer of the device and thus, for example, reduce the breakdown voltage of a p-n junction. Said surface zone may also give rise locally to an undesirable readily conducting current path which may cause short-circuit or other adverse phenomena in the semoconductor device.

It is, inter alia, for these reasons, often very desirable in practice that the semiconductor surface covered by an inset oxide pattern be doped not in its entirety but only locally or selectively by an activator of a given type. As a result of this, structures are obtained which, as will be described in detail below, offer many important applications in semiconductor technology.

Since in general it will not be possible to realize such a structure without extra process steps, for example, extra masking and alignment steps, the use of said structures in manufacturing semiconductor devices, whether or not in the form of integrated circuits, often meets with drawbacks. As is well-known, extra masking steps inevitably reduce yields and increase costs and should be avoided if at all possible.

It is one of the objects of the present invention to provide a method by which a structure having an inset oxide pattern which is bounded by at least one zone of the surface which is doped only locally by the incorporation of activators, can be obtained in a simple manner and in which the above-mentioned drawbacks are avoided or are mitigated at least considerably.

The invention is inter alia based on the recognition of the fact that said local or selective doping can be obtained without an extra alignment step by an efficient use of the presence of a freely projecting edge of a mask obtained already in a preceding operation.

A method of the type mentioned in the preamble is therefore characterized according to the invention in that a mask, the first mask, is first provided on a surface of the body after which a recess is formed in the part of the surface not covered by said mask by removing material, in which operation material is also removed below the edge of the mask so that the edge of the mask projects freely, a surface zone adjoining the surface of the recess being locally or selectively doped with activators while using the masking provided by the freely projecting edge parts of the mask, the oxide pattern being obtained by oxidation of at least the uncovered semiconductor surface during which oxidation the recess is at least partly filled up by oxide.

In the method according to the invention the desirable local doping is realized, without an extra alignment step being required, by using the freely projecting edge parts of the mask obtained after removing the material.

The masking provided by the freely projecting mask edge may be used in various manners.

First of all, said freely projecting edge may be used directly as a masking against activators, for example, upon providing said activators by ion bombardment or by vapour deposition and in general in all those doping methods in which the activators are supplied according to a stream or jet directed substantially transverse to the mask. In connection therewith, an important preferred embodiment according to the invention is characterized in that the surface of the recess is locally doped by a stream of activators incident transverse to the first mask, the parts of the surface present below the projecting edge of the first mask being masked against doping.

However, the masking effect of the freely projecting mask edge can also be used indirectly for providing a local doping, namely by first providing, while using said projecting first mask, a second mask, for example, an oxide mask which masks against activators, after which said second mask is used to obtain the local doping. Therefore, according to a further important preferred embodiment, a second mask is provided on the surface of the recess while using the masking provided by the freely projecting edge parts of the first mask, the circumference of said second mask within the recess coinciding in projection substantially with the circumference of the first mask, the unmasked parts of the surface of the recess being then doped with activators.

An important preferred embodiment is characterized in that after removing the material a second mask is provided on those surface parts of the recess which are present below the projecting edge of the first mask, the uncovered surface parts of the recess not situated below said projecting edge being then doped by an activator. So in this case the parts of the semiconductor surface present below the projecting edge of the first mask are not doped or are doped at least to a considerably smaller extent than the remaining part.

Conversely, another preferred embodiment is characterized in that after removing the material a second mask is provided, for example, by vapour deposition, on the surface of the recess with the exception of those surface parts which are present below the projecting edge of the first mask, after which the surface parts of the recess not covered by the second mask are doped by an activator. In this manner a second mask is obtained which is complementary to the preceding one.

In order to reach the required depth, the parts of the semiconductor body not covered by the second mask are sometimes advantageously subjected to a further etching treatment after providing the second mask and prior to the doping.

In all these cases the second mask can be provided in various manners. A very efficacious and in addition very simple proferred embodiment which can advantageously be used for manufacturing the two said complementary forms of the second mask is characterized in that a first mask is provided which masks against radiation to which a photoresist is sensitive, that, after the removal of the material, a masking layer is provided at least on the whole surface of the recess, that, in order to form the second mask, at least said masking layer is fully covered by the said photoresist, that said photoresist is exposed to light via the first mask, as a result of which, after the exposure, a part of the photoresist is soluble and another part is insoluble in a developer as a result of the masking provided by the projecting edge of the first mask, the soluble part of the photoresist being then removed and the masking layer being etched away at the places not covered by the photoresist, the remaining photoresist being then removed, the remaining parts of the masking layer forming the second mask. Dependent upon the fact whether a positive or a negative photoresist is used in this preferred embodiment, one of the said complementary second masks will be obtained.

According to another preferred embodiment, the second mask can advantageously be provided so that after removing the material a first layer which masks against activators is provided on the whole surface of the resulting recess, that a second layer which masks against etching is deposited, for example, by sputtering or vapour deposition, from a direction transverse to the first mask on those parts of the first layer which are not masked by the projecting edge parts of the first mask, the parts of the first layer not covered by the second layer being then removed by etching and the uncovered parts of the surface of the recess being doped by activators.

In certain circumstances, the above preferred embodiments can advantageously be combined in which, for example, first according to one of the above methods, only the parts of the surface of the recess present below the projecting edge of the first mask are doped with an activator, for example, by diffusion of a donor, after which, after removing the diffusion mask used, another activator is provided on the surface of the recess with the exception of the parts present below the edge of the first mask, for example, by vapour-depositing an acceptor. As a result of this and if desired, the whole surface of the recess can be filled by regions of different local doping.

The material removal, as a result of which the recess with the freely projecting mask edge is formed, can be carried out in various ways. For example, said removal can be carried out by providing a first mask which masks against oxidation and oxidizing the surface not covered by said first mask, after which the formed oxide is removed by etching. Semiconductor parts below the edge of the first mask are also oxidized during said oxidation so that in the selective etching away of the oxide the desirable freely projecting mask edge is obtained.

The material removal is preferably carried out, however, by etching the semiconductor surface which is not covered by the first mask. This can be carried out both by liquid and by gaseous etchants, the freely projecting mask edge being obtained by under-etching.

In all these cases the formed recess can partly be filled up by oxidation. Preferably, however, in order to obtain a semiconductor body having a substantially plane surface, the resulting recess will be filled up substantially entirely by oxide.

The doping can be carried out according to various known methods, for example, diffusion combined or not combined with vapour deposition. According to a very important preferred embodiment, the doping is carried out by using ion implantation. This method is to be preferred in particular in those cases in which the projecting edge of the first mask is directly used as a masking against a stream of donors or acceptors incident on the semiconductor body. Furthermore a doped oxide layer on the semiconductor surface may be used as a doping source, in combination with diffusion and/or ion-implantation.

In many cases it is recommendable to provide the mask which masks against doping with a metal layer prior to carrying out the doping, as a result of which the masking becomes even more effective. This is of importance in particular when doping is carried out by ion implantation. In this latter case the ions can be implanted comparatively deep while nevertheless an efficient masking is obtained.

Independent of the relative variation of the method, the structure resulting from the use of the method described can be used for various important applications. In this connection, a very important preferred embodiment of the method according to the invention is characterized in that a ring-shaped recess is provided which fully surrounds an island-shaped region of the semiconductor body and that at least one semiconductor circuit element is fully or partly provided in said island-shaped region.

A ring-shaped recess is to be understood to mean herein generally a recess in the form of a slot closed in itself which, however, need by no means be circular.

The structure obtained according to the last-mentioned preferred embodiment can be used in various manners for the mutual electric insulation of semiconductor circuit elements within the same semiconductor body.

According to an important preferred embodiment the said surface zone of the recess is doped with an activator of the same conductivity type as the adjoining region of the semiconductor body. This surface zone may serve, for example, for interrupting an inversion channel which may be formed below the oxide pattern.

According to another preferred embodiment the recess is provided in an epitaxial layer present on a substrate. This preferred embodiment is of particular importance for manufacturing integrated structures. In this case the said surface zone of the recess is advantageously doped with an activator of a conductivity type opposite to that of the epitaxial layer.

According to an important preferred embodiment, the recess is provided in an epitaxial layer of a first conductivity type which is present on a substrate of the second conductivity type, the said surface zone (so in this case of the second conductivity type) being provided over such a large depth as to adjoin the substrate. In this manner an island isolation is obtained which is analogous to that obtained by means of the conventionally used isolation diffusion in integrated circuits, in which, in this case, however, no extra masking and alignment step is necessary for realizing the doped zone below the oxide.

A quite different method of isolation is obtained when using a further very important preferred embodiment of the invention. This preferred embodiment is characterized in that the recess is provided in an epitaxial layer of the first conductivity type which has been grown on a substrate of the first conductivity type, a buried layer of the second conductivity type being present between the epitaxial layer and the substrate and extending at least below the said island-shaped region, the said surface zone of the second conductivity type being provided over such a large depth as to adjoin the buried layer. In this case an epitaxial layer is used of the same conductivity type as the substrate, the isolation being produced by the buried layer and the adjoining doped zones which adjoin the oxide pattern.

The presence of the oxide pattern can advantageously be used for passivating p-n junctions on their line of intersection with the semiconductor surface. For that purpose, a further preferred embodiment is characterized in that a semiconductor circuit element is provided having at least a p-n junction extending substantially parallel to the semiconductor surface outside the recess, the oxide pattern being provided at least on the line of intersection of said p-n junction with the surface of the recess.

The invention furthermore relates to a semiconductor device manufactured by the method as described above.

In order that the invention may be readily carried into effect, a few embodiments thereof will now be described in greater detail, by way of example, with reference to the accompanying drawings in which FIG. 1 is a diagrammatic plan view of a part of a first semiconductor device manufactured by using the method according to the invention.

The Figures are diagrammatic and not drawn in scale. Corresponding parts in the Figures are referred to by the same reference numerals.

Figure 1:
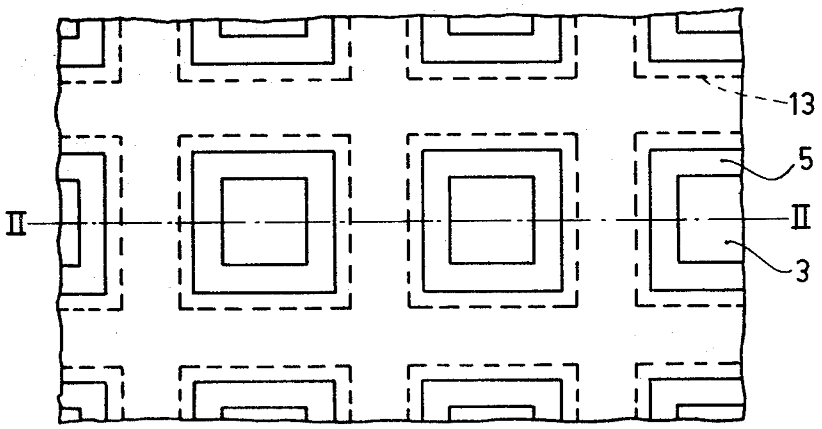
Figure 2:
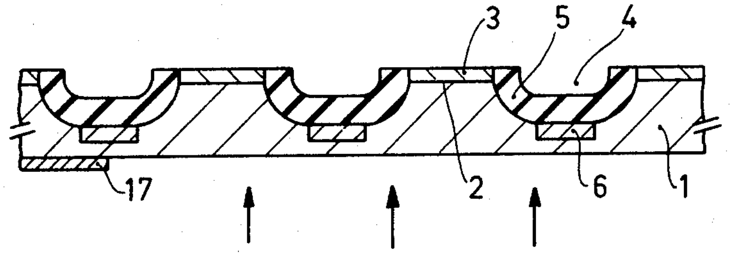
FIG. 2 is a diagrammatic cross-sectional view of this device taken on the line II—II of FIG. 1.
Figure 3:
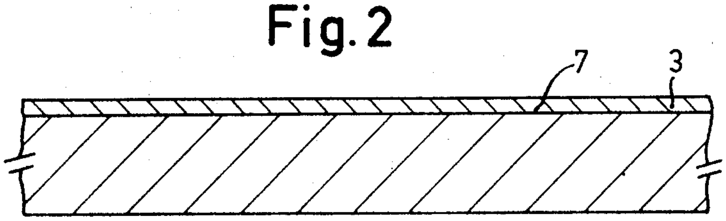
FIGS. 3 to 8 are diagrammatic cross-sectional views of the device shown in FIGS. 1 and 2 in successive stages of manufacture.
Figure 4:
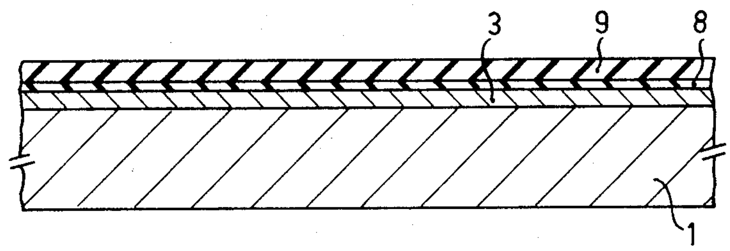

FIG. 1 is a plan view and FIG. 2 a diagrammatic cross-sectional view taken on the line II—II of FIG. 1 of a target plate for converting electromagnetic radiation into electric signals, to be used in camera tubes of, for example, television cameras. This target plate (see FIGS. 1 and 2) consists of a plate 1 of n-type silicon having a resisitivity of 8 ohm.cm which comprises on one side radiation-sensitive mesa-diode structures having p-n junctions 2 which are present between the plate 1 and a p-type layer 3 diffused in said plate. The grooves 4 between the mesas are covered with a layer 5 of silicon oxide which at the bottom of the grooves adjoins a surface zone 6 of n-type silicon having a higher doping than the region 1. As a result of this the possibility of depletion layers of adjacent diodes touching each other is considerably restricted and the formation of an inversion layer as a result of which an undesirable electric connection between adjacent diodes might occur is also counteracted. Furthermore, as a result of the difference in doping concentration between the zone 6 and the region 1, a drift field is inherently formed by which charge carriers generated locally under the influence of incident radiation are prevented from moving to a diode other than the nearest diode. The n-type zone 6 does not adjoin the p-type layer 3 but is separated therefrom by the n-type region 1.

This target plate can be assembled in a camera tube in normal manner. The radiation is incident, for example, on the side of the plate remote from the layer 3 in the direction of the arrows in FIG. 2, while the plate on the side of the layer 3 is scanned by an electron beam, a part of the surface on which the radiation is incident comprising a connection contact 17 which preferably extends along the whole edge of the plate. For details as regards the arrangement and operation of such a target plate reference is made, for example, to the article "Bell System Technical Journal"Volume 48, 1969, pp. 1481 - 1528.

As a result of the presence of the highly doped n-type zone 6, undesirable electric connections between the diodes are prevented. This would also be achieved when the n-type zones 6 would extend throughout the surface of the recess up to the p-type layer 3. As compared with such structures, the device shown in FIG. 2 has the important advantage that the breakdown voltage of the diodes is considerably higher and the diode capacity is considerably lower.

According to the invention the device described can simply be manufactured as follows, see FIGS. 3 to 8.

Starting material is a monocrystalline plate 1 of n-type silicon oriented according to the (111) direction and having a resisitivity of 8 Ohm.cm, a diameter of 25 mm and a thickness of 250 μm. A surface 7 of said plate is polished flat after which boron is diffused in said surface. A p-type surface layer 3, 0.5 μm thick, surface concentration $10^{19}$ acceptor atoms/ccm, is obtained, see FIG. 3.

A layer 8 of silicon nitride, 0.15 μm thick, is then provided on the surface in known manner by heating in an atmosphere containing $SiH_4$ and $NH_3$ at a temperature of approximately 1,000°C. A layer 9 of silicon oxide, 0.8 $\mu$m thick, is then provided on said layer 8 by heating in an atmosphere containing $SiH_4$, $CO_2$ and $H_2$. For all the details of the method to be used for providing the silicon nitride and silicon oxide layers mentioned in this example and in the following examples, as well as for etching said layers, reference is made to "Philips Research Reports"April, 1970, pp. 118 – 132, and the above-mentioned Canadian and U.S. patents, in which publications all information necessary to those skilled in the art is given.

Figure 5:
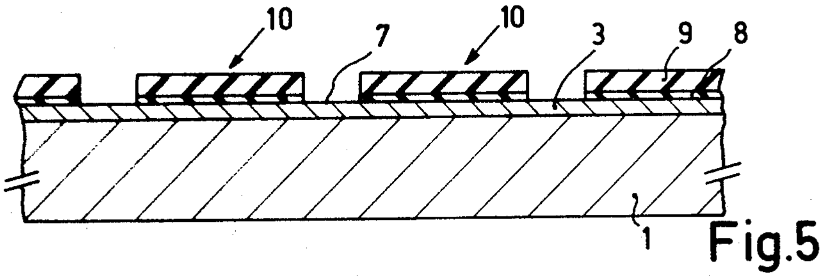
Figure 6:
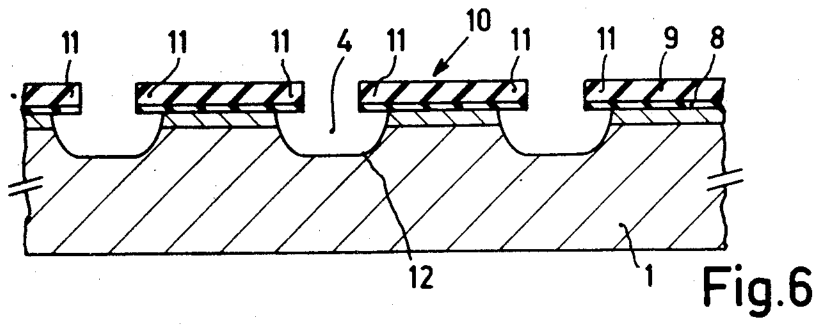

While using photoresist methods generally used in semiconductor technology, a first mask consisting of square islands 10 of 17 $\mu$m × 17 $\mu$m having a pitch (center-to-center spacing) of 22 $\mu$m is formed from said double layer of silicon nitride and silicon oxide. The structure shown in FIG. 5 is obtained.

The surface 7 of the plate is then etched at 2 °C for 1 minute with an etching liquid consisting of 170 ccm of 60 % $HNO_3$, 280 ccm of fuming $HNO_3$, 110 ccm of 40 % HF and 440 ccm of glacial acetic acid while covering the other surface of the plate with an etchant-resistant lacquer. As a result of this a recess consisting of grooves 4 (see FIG. 6) of approximately 5 $\mu$m deep are etched in the part of the surface 7 not covered by the mask 10. Material is also removed below the edge of the islands 10 so that the edge 11 of the mask 10 projects freely over a width of approximately 3 $\mu$m, see FIG. 6.

Figure 7:
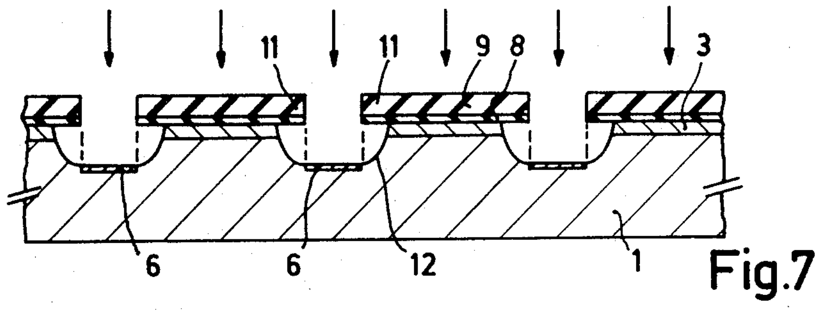

While using masking by said freely projecting edge parts 11 of the mask 10, a surface zone 6 adjoining the surface 12 of the grooves 4 is locally or selectively doped with phosphorus by means of ion implantation, see FIG. 7. For that purpose, the plate is placed in an apparatus for ion implantation and exposed to a stream of phosphorus ions which are incident substantially transverse to the mask 10 in the direction of the arrows in FIG. 7, the parts of the surface 12 present below the projecting edge 11 of the mask 10 being masked against doping. The energy of the incident phosphorus ions is $2.10^4$ eV, the implanted phosphorus ion density is $10^{14}$ ions per sq.cm.

Figure 8:
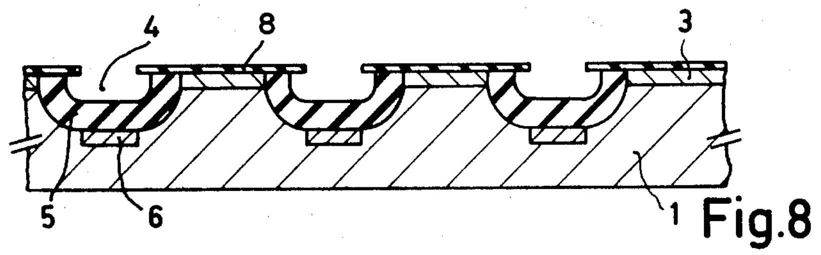

The thick oxide layer 9 associated with the mask 10 is then removed in normal manner by etching in a buffer solution with $NH_4F$, after which the plate is oxidized at 1,000 °C for 4 hours in water vapour which is saturated at 95 °C. During this oxidation the grooves 4 are partly filled with silicon oxide 5. The silicon nitride layer 8 masks against oxidation the silicon present below said mask so that the oxide pattern is formed only in the grooves 4. Also during the oxidation the n-type zone 6 diffuses further in the silicon to a depth of approximately 1.5 $\mu$m below the oxide 5. As a result of this the structure shown in FIG. 8 is obtained. The outline of the zone pattern 6 is indicated in FIG. 1 by the dashed lines 13.

The silicon nitride layer 8 which during this treatment has oxidized superficially is then removed by means of phosphoric acid at 180° C. The plate is then etched thin to an overall thickness of approximately 30 $\mu$m and provided, if desirable, on the side of the diodes with further layers to improve the action of the target plate (see, for example, the already mentioned article in "Bell System Technical Journal"), provided with a contact 17 in normal manner (see FIG. 2), and assembled in a camera tube.

The structure described and the manufacture thereof can be varied in various manners. For example, the oxidation may also be continued until the oxide 5 substantially fully fills the grooves 4 so that a flatter surface is obtained. Besides by ion implantation, the doping of the zones 6 may also be carried out, for example, by vapour-depositing donors in the direction of the arrows in FIG. 7. Furthermore, the oxide layer 9 which serves to improve the masking against ion implantation may be replaced by another layer, for example, by a metal layer.

Figure 9:
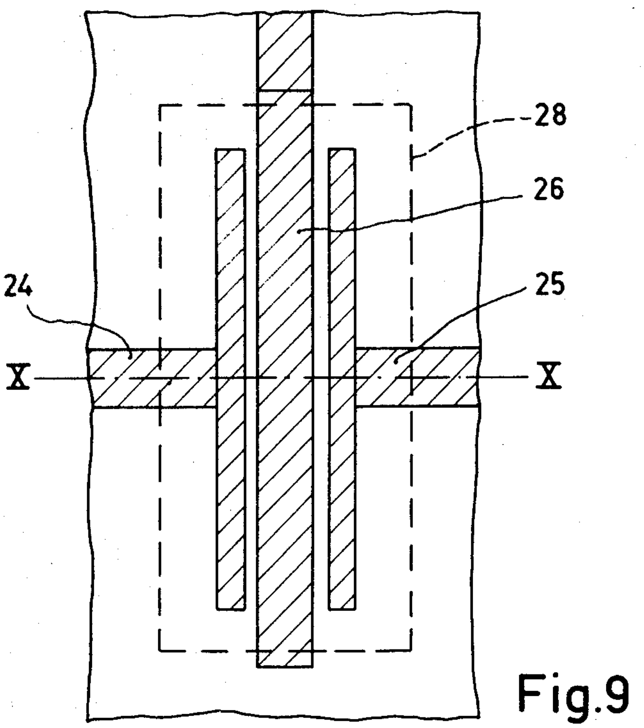
FIG. 9 is a diagrammatic plan view of a second semiconductor device manufactured by using the method according to the invention.
Figure 10:
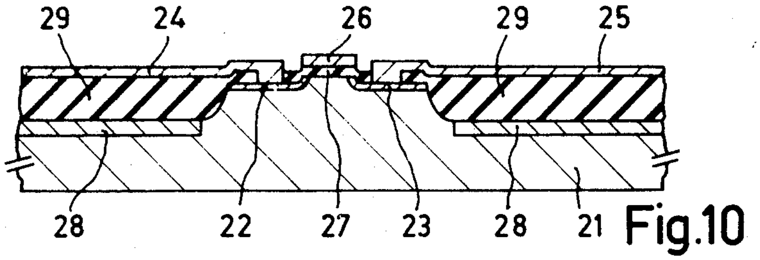
FIG. 10 is a diagrammatic cross-sectional view of said device taken on the line X—X of FIG. 9.

FIG. 9 is a plan view and FIG. 10 is a cross-sectional view taken on the line X—X of FIG. 9 of an insulated gate field effect transistor in this case a MOS transistor, manufactured by using the method according to the invention. The device (see FIG. 10) comprises a p-type, (111) oriented silicon plate 21 having a resistivity of 1 Ohm cm, n-type source and drain zones 22 and 23 with adjoining metal layers 24 and 25, and a gate electrode in the form of a metal layer 26 which is separated from the p-type region 21 by a silicon oxide layer 27. The device furthermore comprises a p-type surface zone 28 having such a high doping that in said zone no inversion layer can be formed in the normal operating condition. This surface zone 28 adjoins a pattern 29 of silicon oxide which is inset in the silicon.

The formation of undesired electric connections between the source and/or drain zone and other parts of the semiconductor plate in which further circuit elements may be provded, if desirable, is avoided by the zones 28 the boundary of which is shown in broken lines in FIG. 9.

Figure 11:
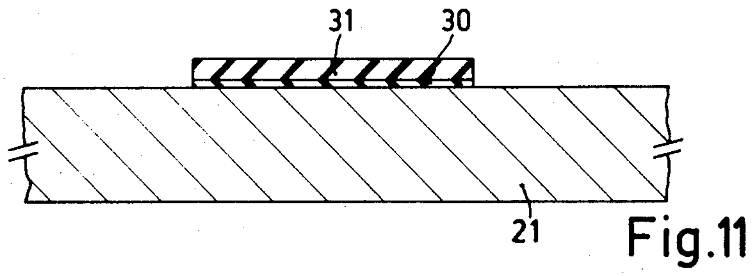
FIGS. 11 to 16 are diagrammatic cross-sectional views of the device shown in FIGS. 9 and 10 in successive stages of manufacture.
Figure 12:
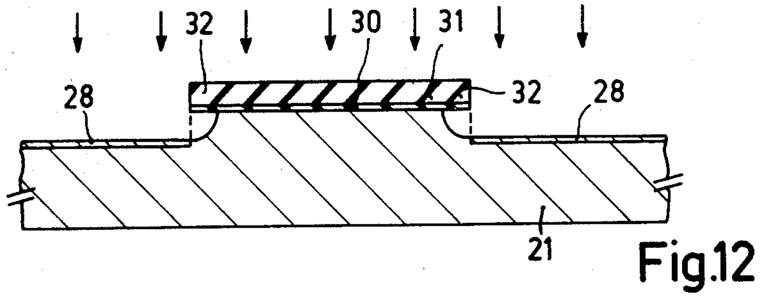
Figure 13:
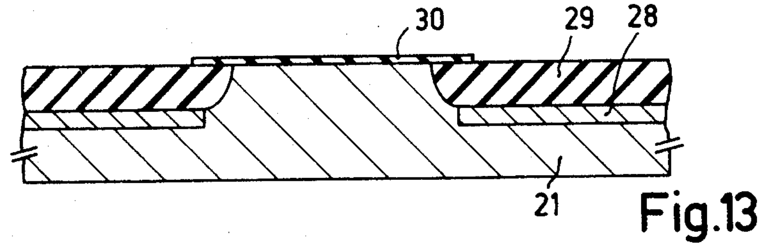

According to the invention the device is manufactured as follows, see FIGS. 11 to 16. Starting material is a (111) oriented p-type silicon plate 21 having a resistivity of 1 Ohm cm. As in the preceding example, a layer 30 of silicon nitride, 0.15 $\mu$m thick, and a layer 31 of silicon oxide, 0.8 $\mu$m thick, which is given the shape of a rectangle of 100 $\mu$m × 200 $\mu$m by known photoresist methods, are provided on said plate. The structure shown in the cross-sectional view of FIG. 11 is obtained. This rectangle consisting of the layers 30 and 31 forms the first mask. The silicon regions not covered by said mask are then etched until a recess, approximately 2 $\mu$m deep, and a freely projecting mask edge 32 (see FIG. 12), 2 $\mu$m wide, have formed, for example, in an isopropanol-saturated solution containing 850 ccm of $H_2O$ and 250 g of KOH, at 85 °C. By implanatation of boron ions in the dirction of the arrows in FIG. 12, at $2.10^4$ eV and with a density of $10^{14}$ ions/sq.cm analogous to the preceding example, a p-type surface zone 28 is obtained in the silicon regions not present below the mask (30, 31), see FIG. 12.

The oxide 31 is then removed with an aqueous HF solution and the recess in the silicon plate resulting from the etching is substantially entirely filled with silicon oxide 29 (see FIG. 13) by heating at 1,000 °C for 10 minutes in dry oxygen, 1 hour in dry nitrogen and 16 hours in water vapour saturated at 95°C, the zone 28 obtaining an overall thickness of 1.2 $\mu$m by diffusion.

Figure 14:
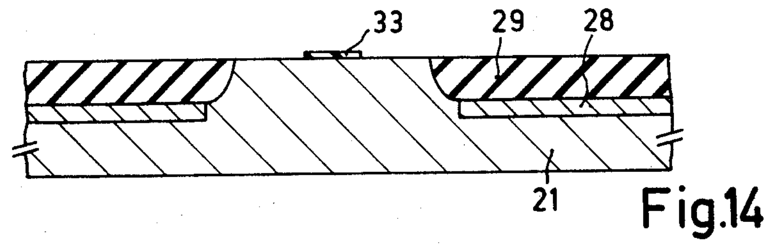
Figure 15:
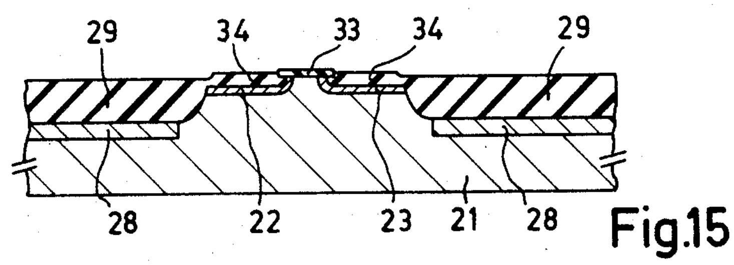

While using a photoresist method, the nitride layer 30 is partly etched away after which a strip 33, dimensions 10 $\mu$m × 200 $\mu$m, remains (see FIG. 14). This strip 33 is used as a diffusion mask for an arsenic diffusion which is succeeded by an oxidation at 1,000 °C in water vapour saturated at 95°C, after which the structure shown in FIG. 15 has formed with in-diffused n-type source and drain zones 22 and 23 covered by an oxide layer 34 adjoining the inset oxide 29.

Figure 16:
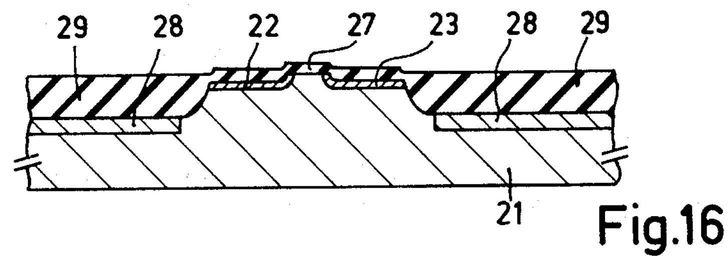

The nitride layer 33 is now removed in phosphoric acid at 180 °C and an oxide layer 27, 0.2 $\mu$m thick, is provided on the silicon present between the source and drain zones 22 and 23 by a fresh oxidation at 1,000 °C (See FIG. 16). Contact windows are then provided and the metal layers 24, 25 and 26 are provided by means of commonly used methods. The gate electrode layer 26 extends on both sides to above the $P^+$zone 28. The above-described structure shown in FIGS. 9 and 10 is obtained.

Figure 17:
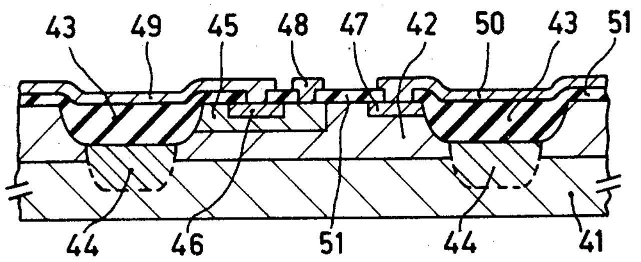
FIG. 17 is a diagrammatic cross-sectional view of a third semiconductor device manufactured by using the method according to the invention. 8

FIG. 17 is a cross-sectional view of a third device which can be manufactured advantageously by using the method according to the invention while using a number of masking and alignment steps which is as small as possible. A ring-shaped inset oxide pattern 43 of silicon oxide is provided which fully surrounds an island-shaped region 42 of an n-type epitaxial silicon layer provided on a p-type substrate 41. A p-type surface zone 44 which extends into in the substrate 41 adjoins the oxide pattern 43. A transistor having a p-type base zone 45, an n-type emitter zone 46 and a diffused n-type collector contact zone 47 is present in the island-shaped region 42. These zones are contacted by metal layers 48, 49 and 50 via contact windows in a silicon oxide layer 51.

The ring-shaped oxide pattern 43 with the p-type zones 44 replace in this example the isolation diffusion extending throughout the thickness of the epitaxial layer 42 and conventionally used in monolithic integrated circuits for the mutual electric isolation of parts of the circuit. An important advantage is that one or more zones associated with a circuit element, for example, the base zone 45 of the transistor in FIG. 17, can be provided against the oxide 43 which reduces the required space considerably. In the normal insulation by isolation diffusion this is not possible. The stray capacitances between the metal layers 49 and 50 and the underlying semiconductor materal are also considerably smaller, due to the presence of the oxide pattern 43, than when using normal isolation diffusions.

Figure 18:
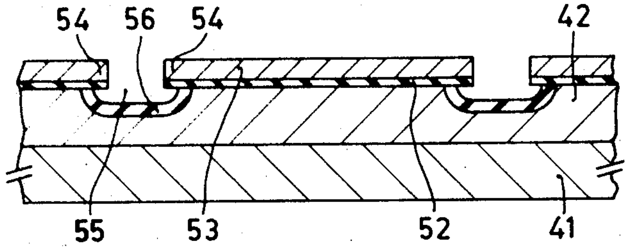
FIGS. 18 to 22 are diagrammatic cross-sectional views of the device shown in FIG. 17 in successive stages of manufacture.

The structure shown in FIG. 17 can be manufactured as follows by using the method according to the invention, see FIGS. 18 to 22. Starting material is a (111) oriented, p-type silicon plate 41 having a resistivity of 5 Ohm. cm. An n-type layer 42, resistivity 1 Ohm cm, thickness 3 $\mu$m, is epitaxially grown on said plate by means of methods generally used in semiconductor technology. In the same manner as in the preceding examples, a silicon nitride layer 52 (see FIG. 18), 0.15 $\mu$m thick, is provided on said epitaxial layer 42. Instead of an oxide layer, a chromium layer 53, 0.4 $\mu$ thick, is vapour-deposited on said nitride layer 52 after which a ring-shaped aperture is etched in said nitride-chromium layer. The chromium may be etched with a solution of 40 % HCl and water in a volume ratio of 1 : 1, and the nitride with phosphoric acid at 180°C. The unmasked silicon in the annular aperture is then etched until, by underetching, a projecting edge 54 (see FIG. 18) of the nitride-chromium mask (the first mask), 1 $\mu$m wide, has been obtained. In the groove 55 resulting from the etching treatment an oxide layer 56, 0.2 $\mu$m thick, is then provided throughout the etched surface by heating in an atmosphere containing $SiH_4$ and water vapour at 400 °C, as a result of which the structure as shown in FIG. 18 is formed. Oxide will also be formed on the mask (52,53) which, however, is not shown in the Figures for clarity and is of no further significance for the manufacture. This oxide layer 56 in this example serves as a masking layer to obtain the doped p-type zones 44 (see FIG. 17).

Figure 19:
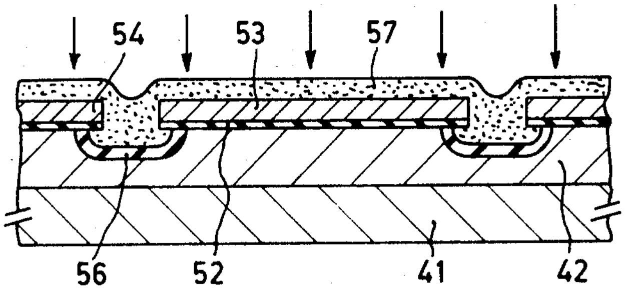

A layer 57 of a positive photoresist, known commercially as "Kaller-Kopierlack"is then provided on the whole surface of the plate (see FIG. 19). A positive photoresist is normally understood to mean an etchant-resistant photosensitive lacquer which, by exposure to light, becomes soluble in a developer associated with said lacquer and is insoluble in said developer in the unexposed condition. A negative photoresist is soluble in the unexposed condition and, after exposure, become insoluble in an associated developer.

Figure 20:
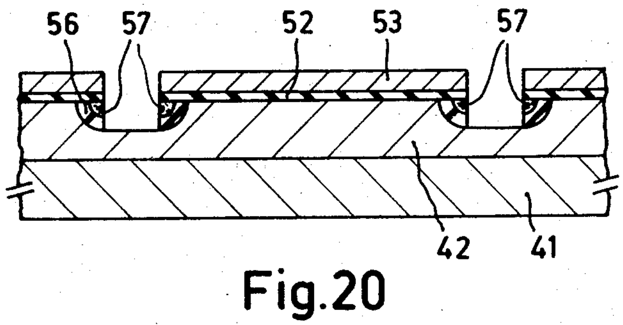

The positive photoresist 57 is then exposed to light in the direction of the arrow in FIG. 19. The masking effect is used of the projecting mask edge 54 which masks against the exposure by the presence of the chromium layer 53. So after developing, the photoresist 57 remains only below said edge 54. By etching with an $NH_4F$-buffered solution of HF, the oxide 56 is removed from the regions not present below the edge 54 so that the structure as shown in FIG. 20 is obtained.

Figure 21:
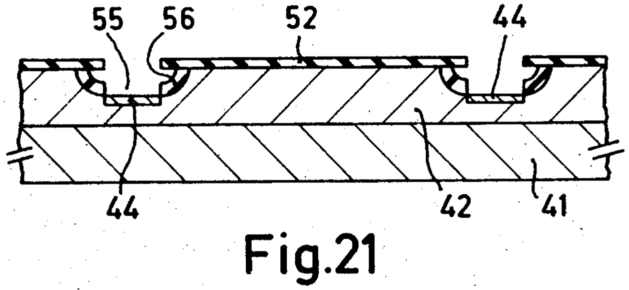

The photoresist 57 and the chromium 53 are then removed chemically with known means, see FIG. 21. So an oxide mask has then been obtained, the second mask, the circumference of which within the recess 55 coincides in projection substantially with the circumference of the first mask.

Figure 22:
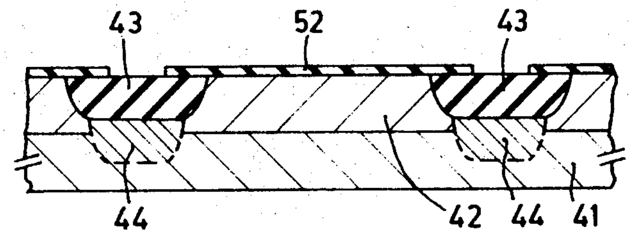

Boron is then indiffused at 950 °C for 10 minutes, so that $p^+$-zones 44 are formed (FIG. 21), succeeded by heating at 1,000 °C for 1 hour in nitrogen and in water vapour saturated at 95 °C for 16 hours. The structure shown in FIG. 22 is obtained, the groove-like recess 55 obtained by etching the silicon being entirely filled by the oxide 43. An island-shaped n-type region 42 is obtained which is separated electrically from the remainder of the semiconductor body by the oxide 43 and the p-n junction between the region 42 on the one hand and the regions 41 and 44 on the other hand, which junction is back-biased in the operating condition. After etching away the nitride layer 52, p and n-type zones can then be indiffused in a manner normally used for the manufacture of monolithic integrated circuits to form one or more circuit elements as described above with reference to FIG. 17.

Figure 23:
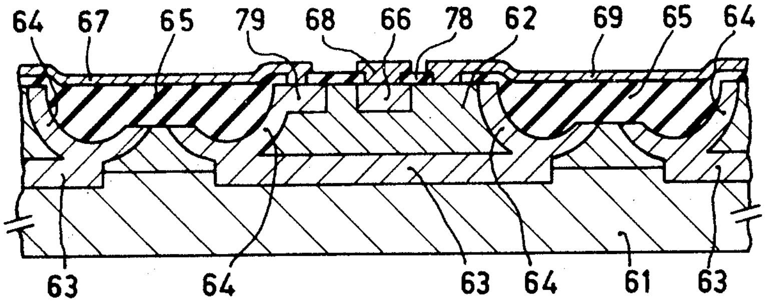
FIG. 23 is a diagrammatic cross-sectional view of a fourth semiconductor device according to the invention.

FIG. 23 is a diagrammatic cross-sectional view of a fourth semiconductor device which, technologically, is of great importance and can also be obtained advantageously by using the method according to the invention. This device comprises a (100)-oriented p-type silicon substrate 61 on which a p-type layer 62 has been grown epitaxially with a thickness of 3 $\mu$m and a resistivity of 1 Ohm.cm. Between the layer 62 and the substrate 61 are present n-type buried layers 63 to which diffused n-type surface zones 64 adjoin which surround the island-shaped region 62 and are bounded by a pattern 65 of silicon oxide inset in the silicon. Within the region 62 an n-type emitter zone 66 adjoining the surface is present which forms a transistor with the region 62 as the base zone and the regions 63 and 64 as the collector zone. This transistor (66, 62, 63, 64) is electrically separated from the remaining region of the silicon body and from further circuit elements possibly present therein by the p-n junction which is cut off in the operating condition between the n-type regions 63 and 64 on the one hand and the p-type region 61 on the other.

The electric isolation obtained in this case of the transistors (66, 62 63/64) shows some analogy to that which has been described by Murphy and other authors in "Proceedings I.E.E.E."September, 1969, pp. 1523–1528. Compared therewith, however, the structure shown in FIG. 23 has the advantage of an important space saving since the oxide pattern 65 with the adjoining zones 64 occupies less space than two juxtaposed isolation diffusions which would be necessary for the manufacture of the structure according to the above-cited article so as to electrically separate individual transistors. In addition, the collector-substrate capacity as well as the capacity between the wiring (67, 68, 69) and the underlying semiconductor body is reduced by the comparatively thick oxide pattern 65.

Figure 24:
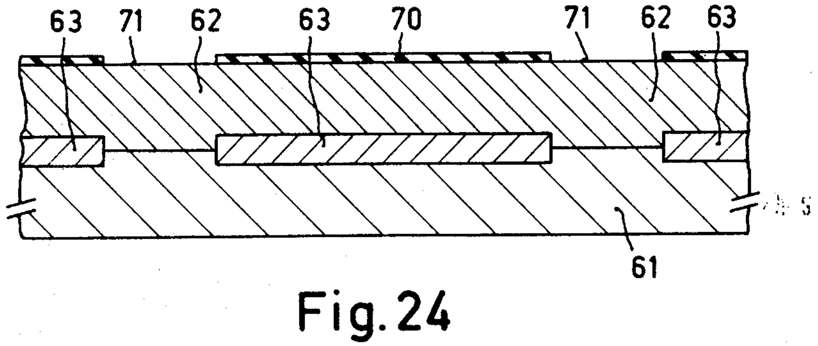
FIGS. 24 to 28 are diagrammatic cross-sectional views of the device shown in FIG. 23 in successive stages of manufacture.

The structure shown in FIG. 23 can be manufactured as follows, see FIGS. 24 to 28. Starting material is a (100)-oriented p-type silicon plate 61 having a resistivity of 1 Ohm.cm. While using generally used methods of diffusion and epitaxial growing, which are of no significance for the invention and which will not be further referred to, local buried layers 63 are then provided in a thickness of 2 $\mu$m and an arsenic concentration of approximately $10^{19}$ atoms/ccm. On said layers an epitaxial p-type layer 62, resistivity 1 Ohm.cm, is grown after which a silicon nitride layer 70, 0.15 $\mu$m thick, is provided on the surface. A ring-shaped aperture 71 is etched in said layer while using a normal photoresist method. The structure shown in FIG. 24 is obtained.

The surface on which the silicon nitride layer 70 is present is then etched with an etchant which attacks the silicon but does substantially not attack the silicon nitride, for example, a mixture of HF, $HNO_3$ and acetic acid.

Figure 25:
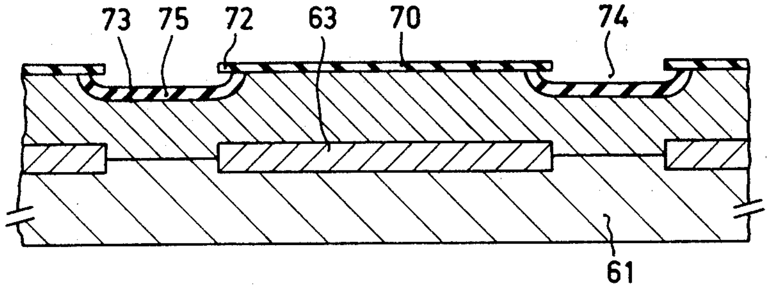
Figure 26:
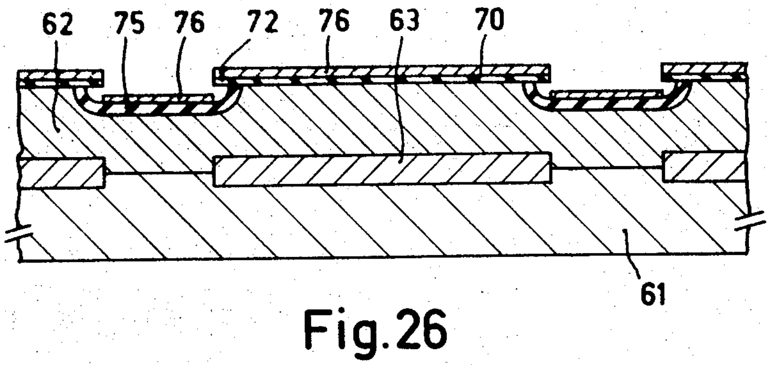
Figure 27:
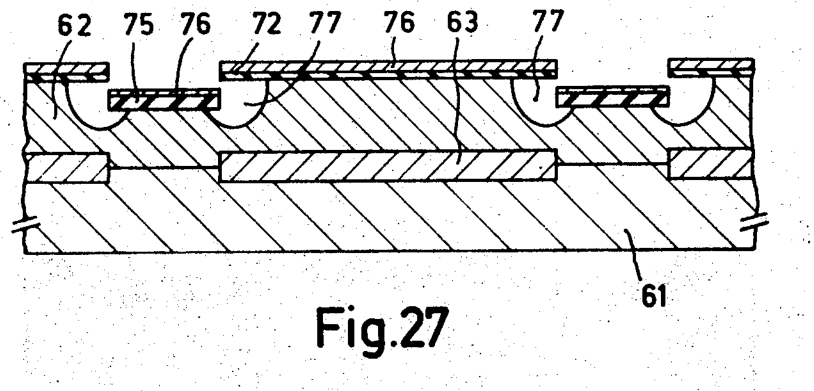
Figure 28:
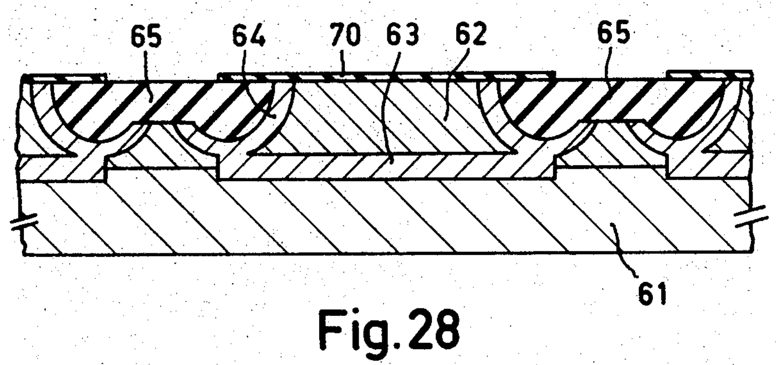

The silicon is etched until such an underetching has occurred that the edge 72 of the nitride mask projects freely by approximately 1 $\mu$m, after which a first layer in the form of an oxide layer 75, 0.4 $\mu$m thick, is formed by oxidation at 1000°C in water vapour saturated at 95°C on the surface 73 of the recess 74 obtained by etching, the silicon covered by the nitride being masked against oxidation. The resulting structure is shown in FIG. 25.

A second layer in the form of a chromium layer 76, 0.15 $\mu$m thick, is then vapour-deposited in a direction transverse to the nitride mask 72. As a result of the masking action of the edges 72 of the nitride mask, the parts of the oxide layer 75 present below said edges remain free from the chromium layer. The oxide not covered by the chromium layer is then etched away after which the exposed part of the silicon surface 73 is etched away over a depth of approximately 1 $\mu$m, the cavities 77 being formed, see FIG. 27. The object of the etching of the cavities 77 is to carry out the phosphorus diffusion to be described below as close to the buried layer 63 as possible and, if desirable, said etching may be omitted dependent upon the depth of said phosphorus diffusion.

The chromium is then removed, for example, by heating in a solution of dilute sulphuric acid after which phosphorus is indiffused so that at the area of the non-masked cavities 77 n-type zones 64 are formed. As in the preceding examples, oxidation is then carried out until the annular groove 74 is entirely filled by oxide, during which treatment the zone 64 diffuses in the silicon until it adjoins the buried layer 63, see FIG. 28. After removing the nitride layer 70 and providing a further oxide layer 78 (see FIG. 23) the n-type emitter zone 66 and an n-type collector contact zone 79 are simultaneously indiffused in normal manner and the connection conductors 67, 68 and 69 in the form of vapour-deposited aluminum layers are provided.

In the above example, according to another variation, the second diffusion mask 75 (as used in FIG. 27), after etching the groove 74, may also be provided directly without using the chromium layer, for example, by vapour-depositing silicon oxide 75 such that no silicon oxide is deposited below the edge 72 of the nitride mask.

Figure 29:
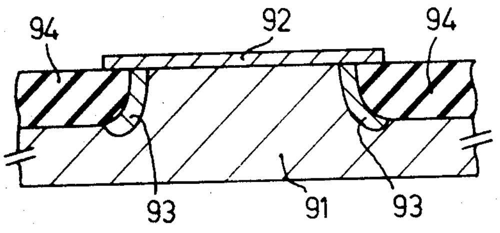
FIGS. 29 to 31 are diagrammatic cross-sectional views of other devices manufactured by using the invention.

Besides for the manufacture of the device shown in FIG. 23, the method according to the invention in which an inset oxide pattern adjoins a doped zone only at the edge may be of advantage in manufacturing many other structures. As an example, FIG. 29 is a cross-sectional view of Schottky diode Schotky diode having a guard ring in which a platinum layer 92 is provided on an n-type silicon plate 91 and forms a rectifying metal-semiconductor junction therewith. An inset oxide pattern 94 having a diffused p-type zone 93 has been provided in any of the above described manners, the zone 93 forming a guard ring of a very low capacity.

Figure 30:
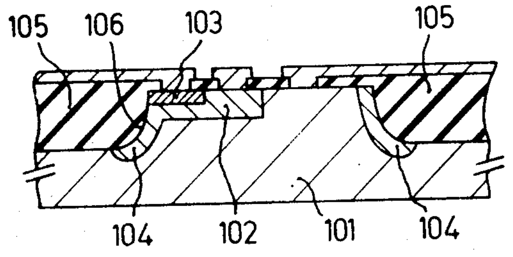

FIG. 30 is a cross-sectional view of a further example from which it appears that a transistor having an n-type collector zone 101, a p-type base zone 102 and an n-type emitter zone 103 can be manufactured with a minimum of space by providing both the emitter-base junction and the collector-base junction in contact with the oxide pattern 105. These two junctions in the interface 106 between the oxide 105 and the silicon are situated, due to the presence of a diffused p-type zone 104, at such a large distance from each other that there is no danger of mutual short circuit at said interface 106 while in the operative region of the transistor the base thickness nevertheless can be very small.

Figure 31:
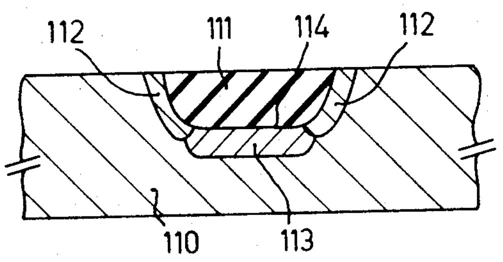

Finally, a structure as shown in FIG. 31 can also be obtained by combination of two complementary masking methods in which an oxide pattern 111 inset, for example, in an n-type semi-conductor 110 is bounded by a p-type surface zone 112 and an n-type surface zone 113 which together cover the whole surface 114.

It will be obvious that the invention is not restricted to the embodiments described by way of illustration, but that many variations are possible to those skilled in the art without departing from the scope of this invention For example, instead of silicon other semiconductor materials may be used which, by oxidation, can form a useful oxide pattern, for example, silicon carbide. Instead of silicon nitride or combined silicon nitride-silicon oxide layers, other layers masking against oxidation may also be used in circumstances. In addition, when using ion implantation as described with reference to FIGS. 7 and 12, the oxide layers 9 and 31, respectively, may be covered with a conductive layer, for example, a metal layer, in order to prevent charging of the oxide and to be able to use ions having a higher energy to obtain implanted zones having larger thickness. In the examples of FIGS. 10, 17, 23, 29 and 30 the oxide patterns 29, 43, 65, 94 and 105 need not completely fill the recesses in which they are provided. Furthermore, the combinations of doped zones covered by oxide patterns obtained in FIGS. 23, 29 and 30 can also be obtained, for example, by using, after the etching of the recess and covering the surface thereof by an oxide layer, the same treatment as described with reference to FIGS. 19 to 21, but this time while using a negative photoresist instead of a positive photoresist. Moreover the doping of the different zones, instead of by diffusion, may be effectuated by other means such as ion implantation, or the diffusions may be carried out starting from a doped oxide layer as a diffusion source. Reference is also made to our concurrently-filed co-pending application, Ser. No. 160,653, which contains claims directed to the structure of FIG. 23.

We claim:

1. A method of manufacturing a semiconductor device comprising at least one semiconductor circuit element, comprising the steps of providing on a surface of a body comprising a semiconductor a first mask which will protect the masked underlying surface portions against an agent capable of removing body material and also against oxidation, subjecting the masked body to the body material removing agent until there is formed in the unmasked surface parts at least one recess that extends below the mask edge whereby the mask edge projects freely over the recess, thereafter, using the freely projecting mask edge as a further mask, locally doping with activator only a part of the semiconductor body portion bordering the recess to form a doped surface zone therein, and thereafter oxidizing at least the exposed semiconductor body surface bordering the recess until the recess is at least partly refilled by a grown oxide which is thereby at least partly inset in the semiconductor body.

2. A method as claimed in claim 1 wherein the oxidizing step is continued until the resulting recess is filled up substantially entirely by grown oxide.

3. A method as claimed in claim 1 wherein the semiconductor body portion bordering the recess is locally doped by directing thereon a stream of activators transverse to the first mask, the parts of the body surface present below the projecting edge of the first mask being masked against doping by the activators.

4. A method as claimed in claim 1 wherein a second mask is provided on the surface of the body part bordering the recess using the masking provided by the freely projecting edge of the first mask, the circumference of said second mask within the recess coinciding in projection substantially with the circumference of the first mask, after which the unmasked parts of the semiconductor body surface bordering the recess are doped with activators.

5. A method as claimed in claim 4 wherein the second mask is provided on only those surface parts of the body part bordering the recess which are present below the projecting edge of the first mask.

6. A method as claimed in claim 4 wherein the second mask is provided on only those surface parts of the body part bordering the recess which are not present below the projecting edge of the first mask.

7. A method as claimed in claim 6 wherein the second mask is formed by a first layer part which masks against activators and which is provided on the whole surface of the body part bordering the recess, and by a second layer part which masks against etching and which is deposited from a direction transverse to the first mask on those parts of the first layer part which not masked by the projecting edge of the first mask, the exposed first layer portions are then removed by etching exposing a part of the surface of the body part bordering the recess.

8. A method as claimed in claim 4 wherein the first mask also masks against radiation to which a photoresist is sensitive, a masking layer is provided on the whole surface of the body part bordering the recess, a photoresist is provided covering the said masking layer, the said photoresist is subjected to radiation exposing the photoresist except where masked by the projecting edge of the first mask, one of the exposed and unexposed photoresist portions is removed exposing part of the masking layer, the exposed part of the masking layer is removed, and the remaining photoresist is then removed, the remaining parts of the masking layer forming the second mask.

9. A method as claimed in claim 4 wherein after provision of the second mask and prior to the doping step, the parts of the semiconductor body which are exposed by the second mask are subjected to a further etching treatment to remove material.

10. A method as claimed in claim 4 wherein the second mask comprises a metal layer.

11. A method as claimed in claim 1 wherein the body material removal is carried out by etching the body surface which is not covered by the first mask.

12. A method as claimed in claim 1 wherein the activators doping is carried out by ion implantation.

13. A method as claimed in claim 1 wherein the recess is ring-shaped and entirely surrounds an island-shaped region of the semiconductor body, and at least one semiconductor circuit element is at least partly provided in said island-shaped region.

14. A method as claimed in claim 13 wherein the recess is provided in an epitaxial layer of a first conductivity type grown on a substrate of the first conductivity type, a buried layer of a second opposite conductivity type is provided between the epitaxial layer and the substrate so as to extend at least below the said island-shaped region, and the said doped surface zone is of the second conductivity type and is provided over such a large depth as to adjoin the buried layer.

15. A method as claimed in claim 13 wherein a semiconductor element is provided having at least a p-n junction extending substantially parallel to the semiconductor surface present outside the recess, and the inset oxide is grown to at least cover the line of intersection of said p-n junction with the recess.

16. A method as claimed in claim 1 wherein the activator doping is with activators forming the same type conductivity as that of the adjoining region of the semiconductor body.

17. A method as claimed in claim 1 wherein the recess is provided in an epitaxial layer present on a semiconductor substrate.

18. A method as claimed in claim 17 wherein the doped surface zone bordering the recess is doped by an activator of a conductivity type opposite to that of the epitaxial layer.

19. A method as claimed in claim 18 wherein the epitaxial layer is of a first conductivity type and the substrate is of a second opposite conductivity type, and the said doped surface zone extends through the epitaxial layer so as to adjoin the substrate.

* * * * *